US 6,743,671 B2

(12) United States Patent
Hu et al.

(10) Patent No.: US 6,743,671 B2
(45) Date of Patent: Jun. 1, 2004

(54) METAL-ON-METAL CAPACITOR WITH CONDUCTIVE PLATE FOR PREVENTING PARASITIC CAPACITANCE AND METHOD OF MAKING THE SAME

(75) Inventors: Man-Chun Hu, Taipei Hsien (TW); Wen-Chung Lin, Taipei Hsien (TW)

(73) Assignee: Ali Corporation, Taipei Hsien (TW)

( * ) Notice: Subject to any disclaimer, the term of this patent is extended or adjusted under 35 U.S.C. 154(b) by 0 days.

(21) Appl. No.: 10/065,663

(22) Filed: Nov. 7, 2002

(65) Prior Publication Data

US 2004/0036143 A1 Feb. 26, 2004

(30) Foreign Application Priority Data

Aug. 9, 2002 (TW) ...................................... 091118043 A

(51) Int. Cl.[7] .......................................... H01L 21/8242
(52) U.S. Cl. ....................... 438/253; 438/396; 438/430; 257/307; 257/534
(58) Field of Search ................................. 438/396, 253, 438/FOR 220, FOR 430; 257/307, 309, 534, 630

(56) References Cited

U.S. PATENT DOCUMENTS

| | | | | |
|---|---|---|---|---|
| 6,261,917 B1 | * | 7/2001 | Quek et al. .................. | 438/396 |
| 6,285,050 B1 | * | 9/2001 | Emma et al. ................. | 257/296 |
| 6,528,838 B1 | * | 3/2003 | Ng et al. ..................... | 257/306 |
| 6,570,210 B1 | * | 5/2003 | Sowlati et al. ............... | 257/307 |
| 2002/0047154 A1 | * | 4/2002 | Sowlati et al. ............... | 257/307 |
| 2002/0093780 A1 | * | 7/2002 | Hajimiri et al. ........... | 361/306.1 |
| 2002/0113292 A1 | * | 8/2002 | Appel .......................... | 257/532 |
| 2003/0003665 A1 | * | 1/2003 | Nakagawa ................... | 438/275 |
| 2003/0062564 A1 | * | 4/2003 | Kobayashi et al. .......... | 257/306 |
| 2003/0117206 A1 | * | 6/2003 | Ohnakado .................... | 327/310 |

* cited by examiner

*Primary Examiner*—George Fourson
*Assistant Examiner*—Fernando L. Toledo
(74) *Attorney, Agent, or Firm*—Winston Hsu

(57) ABSTRACT

An integrated capacitor including a semiconductor substrate is disclosed. An outer vertical plate is laid over the semiconductor substrate. The outer vertical plate of a plurality of first conductive slabs connected vertically using multiple first via plugs. The outer vertical plate defines a grid area. An inner vertical plate is laid over the semiconductor substrate in parallel with the outer vertical plate and is encompassed by the grid area defined by the outer vertical plate. The inner vertical plate consists of a plurality of second conductive slabs connected vertically using multiple second via plugs. A horizontal conductive plate is laid under the outer vertical plate and inner vertical plate over the semiconductor substrate for shielding the outer vertical plate from producing a plate-to-substrate parasitic capacitance thereof. The inner vertical plate is electrically connected with the horizontal conductive plate using at least one third via plug.

17 Claims, 7 Drawing Sheets

METAL-ON-METAL CAPACITOR WITH CONDUCTIVE PLATE FOR PREVENTING PARASITIC CAPACITANCE AND METHOD OF MAKING THE SAME

BACKGROUND OF INVENTION

1. Field of the Invention

The present invention relates to an integrated capacitor and method of making the same. More particularly, the present invention relates to an electrically polar integrated capacitor, which has a substantially perfect matching property, suited for analog/digital (A/D) converters, digital/analog (D/A) converters, or switch cap circuits.

2. Description of the Prior Art

Passive components such as capacitors are extensively used in integrated circuit (IC) design for radio-frequency (RF) and mixed-signal applications, such as filters, resonant circuits, and bypassing. Due to trends toward higher-levels of integration to achieve a reduction in costs associated with IC fabrication processes, the IC industry continually strives to economize each step of the fabrication process to the greatest extent possible.

FIG. 1 is a typical view fragmentarily illustrating a high capacitance density integrated capacitor according to the prior art. As shown in FIG. 1, the prior art integrated capacitor 1 consists of a plurality of parallel-arranged vertical metal plates 100 and 120. In FIG. 1, different shadings are used to distinguish the two terminals of the capacitor 1, where the vertical plates 120 are electrically connected to a terminal A (or node A), and the vertical plates 100 are electrically connected to a terminal B (or node B). The vertical metal plates 100 and 120 are fabricated on a semiconductor substrate (not explicitly shown). Each of the vertical metal plates 100 consists of a plurality of metal slabs 10a, 10b, 10c, and 10d connected vertically using multiple via metal plates 120 consists of a plurality of metal slabs 12a, 12b, 12c, and 12d connected vertically using multiple via plugs 13a, 13b, and 13c. The vertical plate 100 and the vertical plate 120 are isolated from each other by a dielectric layer (not shown). Generally, metal slabs 10a, 10b, 10c, and 10d and metal slabs 12a, 12b, 12c, and 12d of the prior art integrated capacitor 1 are fabricated in an interconnect process known in the art. Unlike the traditional metal-on-metal (MOM) capacitors as known to those versed in the art, the prior art integrated capacitor 1 is fabricated without using extra photo-masks, thereby reducing production cost. Moreover, the prior art integrated capacitor 1 provides higher capacitance per unit area.

However, in operation, parasitic capacitance is produced at both the node A and the node B of the prior art integrated capacitor 1 between the vertical plate 120 and the substrate and between the vertical plate 100 and the substrate, hence rendering the prior art integrated capacitor 1 electrically non-polar. Please refer to FIG. 2 with reference to FIG. 1. FIG. 2 is an equivalent circuit diagram of the prior art integrated capacitor 1 as set forth in FIG. 1. As mentioned, the vertical plates 120 of the integrated capacitor 1 are electrically connected to the node A, and the vertical plates 100 of the integrated capacitor 1 are electrically connected to the node B. In operation, inter-plate capacitance $C_{in}$, parasitic capacitance $C_A$, and parasitic capacitance $C_B$ are generated between the node A and the node B. The parasitic capacitance $C_A$ is induced between lowest metal slab 10a of the vertical metal plate 100 and the electrically grounded semiconductor substrate. The parasitic capacitance $C_B$ is induced between lowest metal slab 12a of the vertical metal plate 120 and the electrically grounded semiconductor substrate. Due to the non-polar property presented by the prior art integrated capacitor 1, the prior art integrated capacitor 1 is therefore not suited for the design of analog/digital (A/D) converters, digital/analog (D/A) converters, or switch cap circuits. Moreover, it is also known that the prior art integrated capacitors 1 suffer from a so-called "matching" problem. Referring to FIG. 3, an enlarged top view of a conventional finger-type integrated capacitor 30 is illustrated. As shown in FIG. 3, the prior art finger-type integrated capacitor 30 comprises a plurality of finger-interlaced like capacitor units 31, each of which consists of a vertical metal plate 311 electrically connected to a node A and a vertical metal plate 312 electrically connected to a node B. The conventional finger-type integrated capacitor 30 is not "matching" because that the four sides (i.e., the a, b, c, d sides as specifically indicated) of the non-symmetric capacitor unit 31 are facing different surrounding environments respectively. One approach to solving this problem is using a dummy metal layout surrounding each of the capacitor units 31. However, this approach cannot perfectly solve the above-mentioned problem and also wastes a great deal of valuable chip area.

SUMMARY OF INVENTION

Accordingly, the primary objective of the claimed invention is to provide an electrically polar integrated capacitor with a high capacitance density, which is perfectly "matching" and is suited for analog/digital (A/D) converters, digital/analog (D/A) converters, and switch cap circuits.

According to one preferred embodiment of the claimed invention, an integrated capacitor having an electrically polar property is disclosed. The integrated capacitor comprises a semiconductor substrate. An outer vertical plate is laid over the semiconductor substrate. The outer vertical plate consists of a plurality of first conductive slabs connected vertically using multiple first via plugs. The outer vertical plate defines a grid area. An inner vertical plate is laid over the semiconductor substrate in parallel with the first vertical plate and is encompassed by the grid area defined by the outer vertical plate. The inner vertical plate consists of a plurality of second conductive slabs connected vertically using multiple second via plugs. A horizontal conductive plate is laid under the outer vertical plate and inner vertical plate over the semiconductor substrate for shielding the outer vertical plate from producing a plate-to-substrate parasitic capacitance thereof. The inner vertical plate is electrically connected with the horizontal conductive plate using at least one third via plug.

The foregoing has outlined, rather broadly, preferred and alternative features of the claimed invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the claimed invention. Those skilled in the art should also realize that such equivalent constructions do not depart from the spirit and scope of the invention in its broadest form.

DETAILED DESCRIPTION

Figure 1:
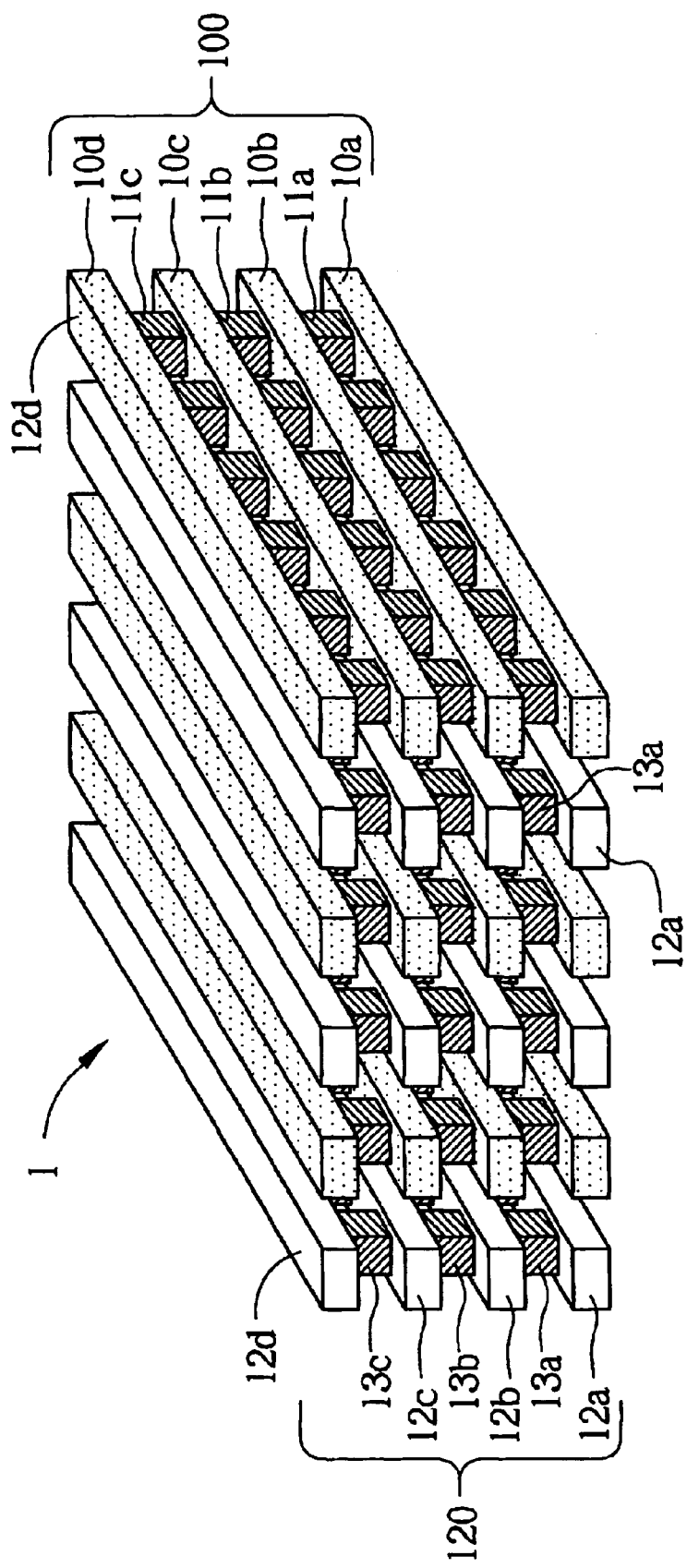
FIG. 1 is an enlarged typical view fragmentarily illustrating a high-density integrated capacitor structure according to the prior art.
Figure 2:
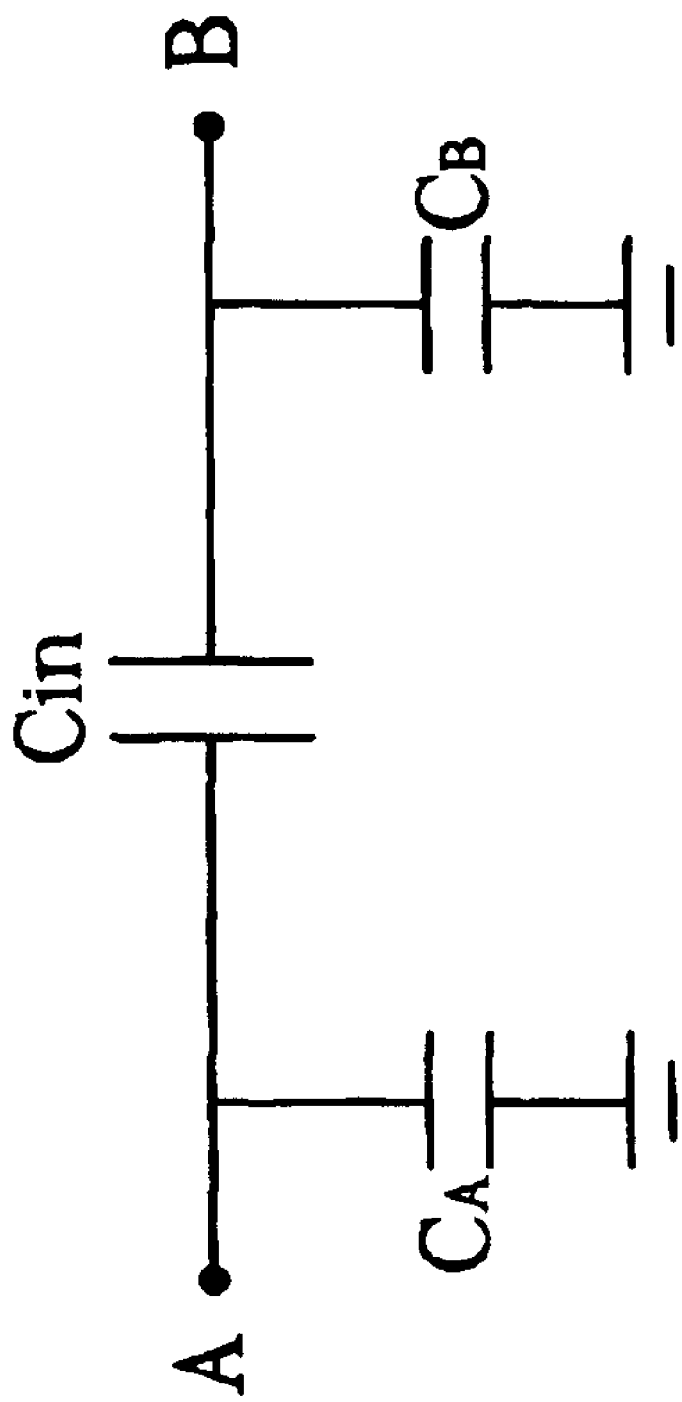
FIG. 2 is an equivalent circuit diagram of the prior art integrated capacitor as set forth in FIG. 1.
Figure 3:
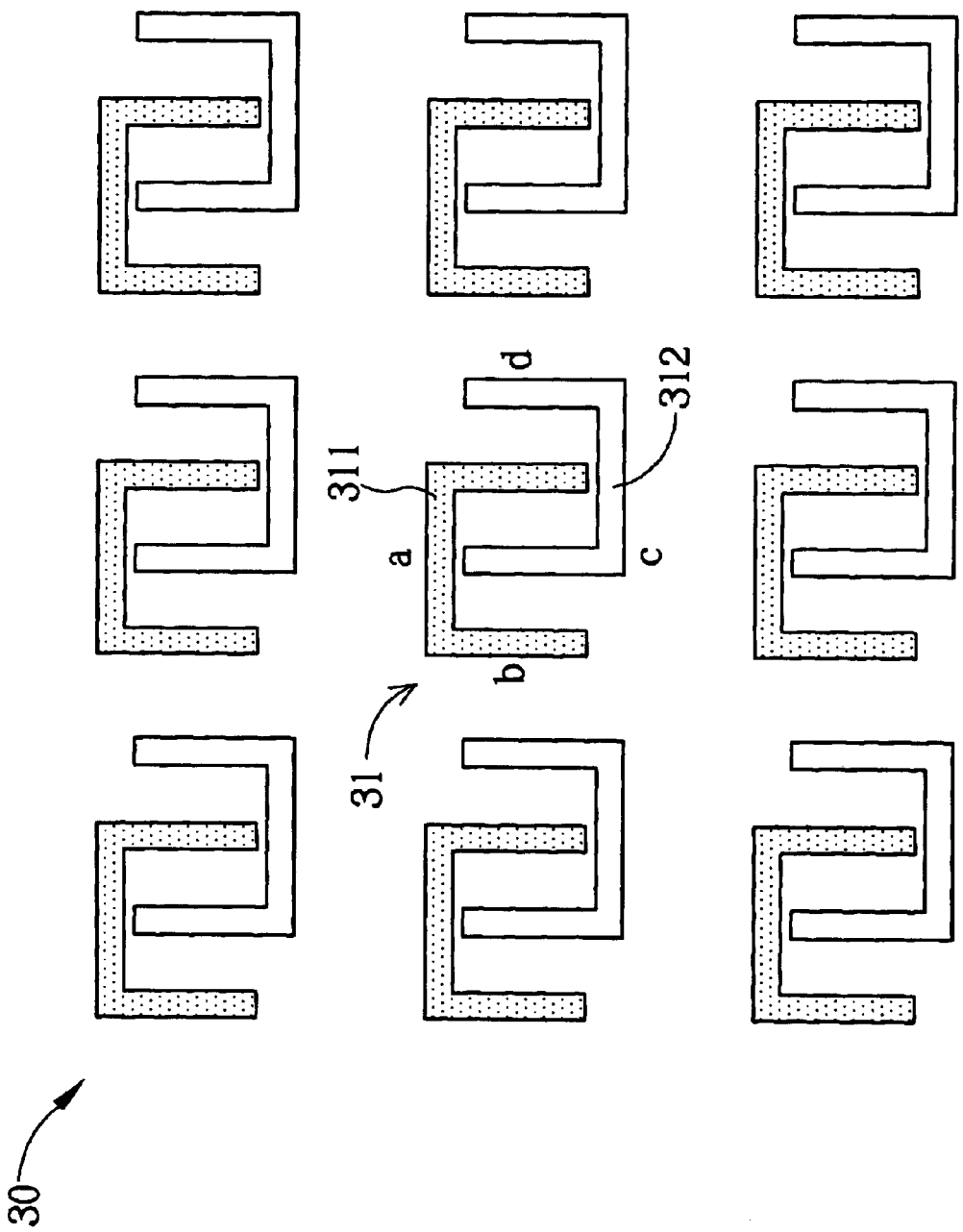
FIG. 3 is an enlarged top view of a conventional finger-type integrated capacitor.
Figure 4:
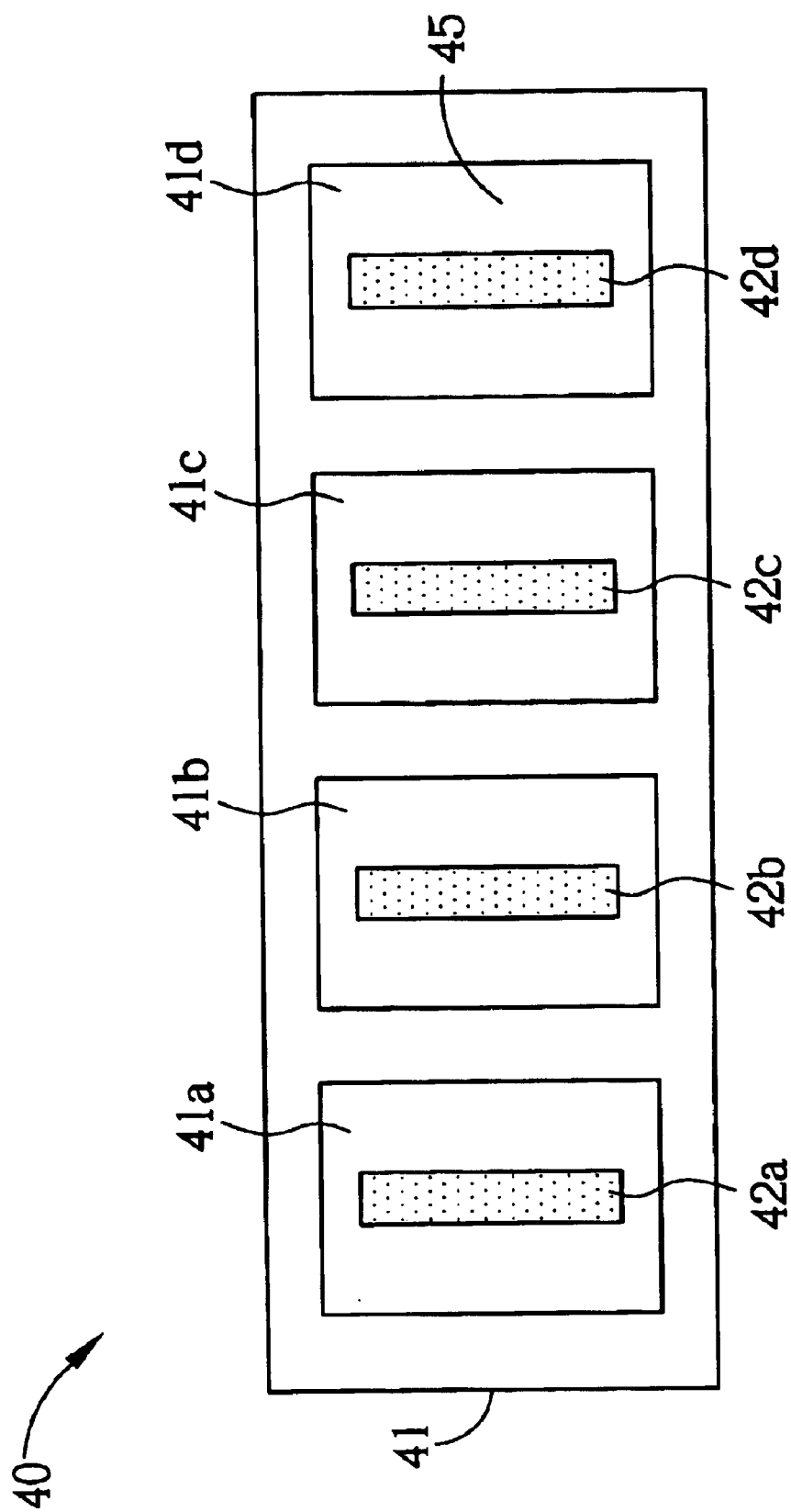
FIG. 4 is an enlarged top view of an integrated capacitor unit according to the present invention.

Please refer to FIG. 4. FIG. 4 is an enlarged top view of a highly-matching integrated capacitor unit 40 according to the present invention. As shown in FIG. 4, the integrated capacitor unit 40 comprises an outer vertical metal plate 41 laid on a semiconductor substrate in a grid form and inner vertical metal plates 42a, 42b, 42c, and 42d arranged in parallel with the outer vertical metal plate 41. In this case, the outer vertical metal plate 41 defines four grid areas 41a, 41b, 41c, and 41d, which accommodate therein the four inner vertical metal plates 42a, 42b, 42c, and 42d, respectively. The outer vertical metal plate 41 is insulated from the four inner vertical metal plates 42a, 42b, 42c, and 42d using an insulation material 45 such as an interlayer dielectrics (ILD) typically used in semiconductor fabrication processes. The outer vertical metal plate 41 and the inner vertical metal plates 42a, 42b, 42c, and 42d are formed on a semiconductor substrate (not shown). Each of the outer and inner vertical metal plates consists of a plurality of metal slabs connected vertically with multiple metal plugs. According to the preferred embodiment of this invention, the outer vertical metal plate 41 is electrically connected to a node A, and the four inner vertical metal plates 42a, 42b, 42c, and 42d are electrically connected to a node B via a bottom conductive plate, which will be discussed later on.

It is noteworthy that the number of grid areas as set forth in FIG. 4 is only exemplary. In a boundary case, integrated capacitor having an outer vertical metal plate 41 defining only one grid area (or two, or three grid areas) thereof also works well according to the present invention. Those versed in the art should appreciate that they can readily use the disclosed conception and specific embodiment as a basis for designing or modifying other structures for carrying out the same purposes of the claimed invention.

Figure 5:
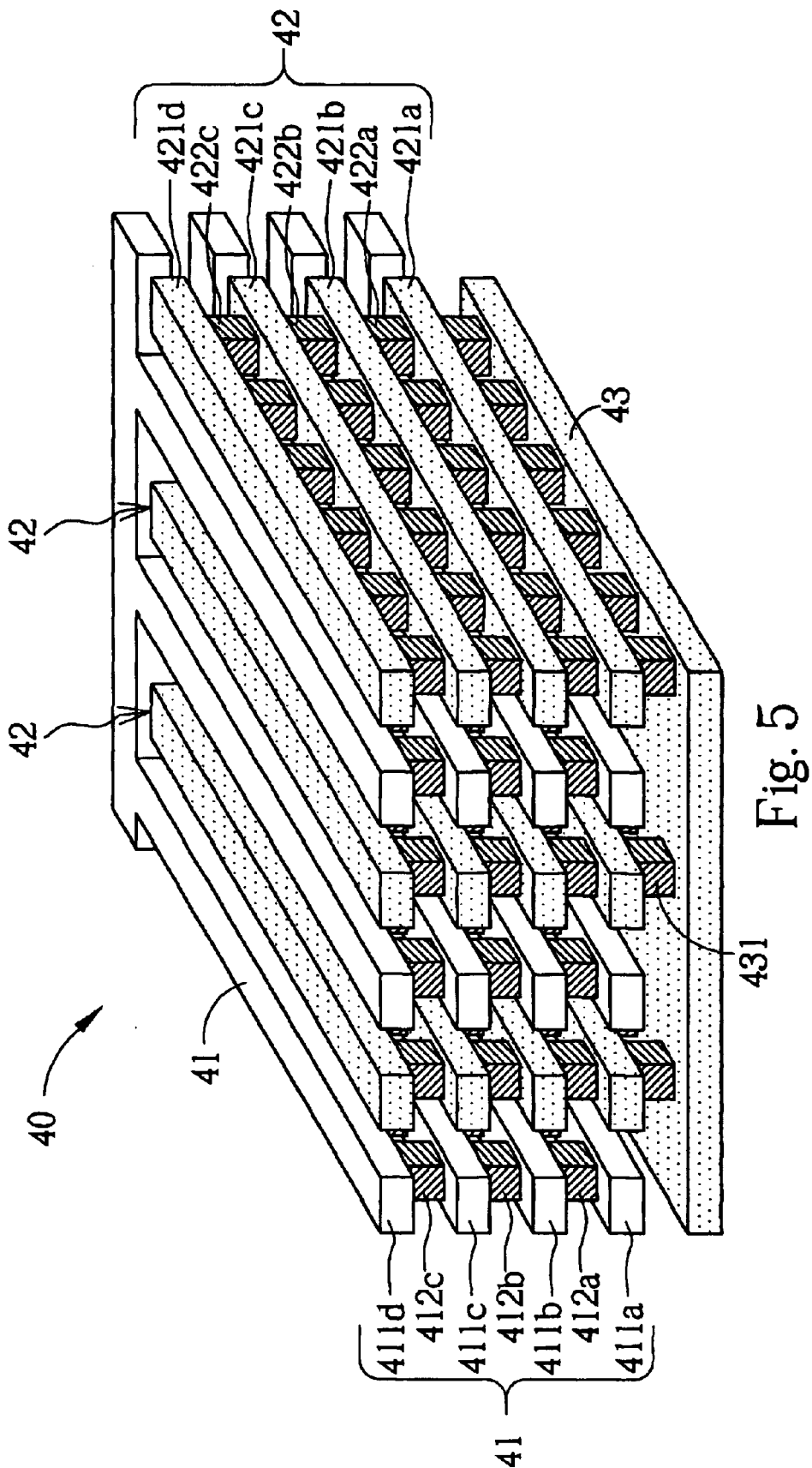
FIG. 5 is an enlarged perspective view fragmentarily illustrating an integrated capacitor unit of FIG. 4.

Please refer to FIG. 5. FIG. 5 is a perspective, cross-sectional view fragmentarily illustrating a high capacitance density, highly-matching integrated capacitor unit 40 as set forth in FIG. 4 according to the present invention. As shown in FIG. 5, the integrated capacitor unit 40 consists of parallel-arranged outer vertical metal plates 41 in a grid form and inner vertical metal plates 42. In FIG. 5, likewise, different shadings are used to distinguish the two terminals of the integrated capacitor unit 40, where the outer vertical metal plate 41 is electrically connected to a terminal A (or node A), and the inner vertical plates 42 are electrically connected to a terminal B (or node B). The vertical metal plates 41 and 42 are fabricated on a semiconductor substrate (not explicitly shown). The outer vertical metal plate 41 consists of a plurality of metal slabs 411a, 411b, 411c, and 411d connected vertically using multiple via plugs 412a, 412b, and 412c that are typically composed of metals. Each of the inner vertical metal plates 42 consists of a plurality of metal slabs 421a, 421b, 421c, and 421d connected vertically using multiple via plugs 422a, 422b, and 422c. The outer vertical plate 41 and the inner vertical plate 42 are isolated from each other by at least one dielectric layer (not shown). According to this invention, metal slabs 411a, 411b, 411c, and 411d and metal slabs 421a, 421b, 421c, and 421d of the integrated capacitor unit 40 are fabricated in an interconnect process known in the art. Since the integrated capacitor unit 40 is fabricated without using extra photomasks, production cost is reduced.

Still referring to FIG. 5, the integrated capacitor unit 40 of this invention further comprises a horizontal bottom conductive plate 43 laid between the underlying semiconductor substrate (not explicitly shown) and the overlying integrated vertical metal plates 41 and 42. The horizontal bottom conductive plate 43 is electrically connected with the inner vertical metal plates 42 using via plugs 431. The horizontal bottom conductive plate 43 is electrically isolated from the outer vertical metal plate 41 using at least one dielectric layer (not shown). The horizontal bottom conductive plate 43 is made of conductive materials such as metals or polysilicon. According to the preferred embodiment of the present invention, the conductive plate 43 is defined with the first layer metal (metal 1) in the interconnection process of the integrated circuit.

Figure 6:
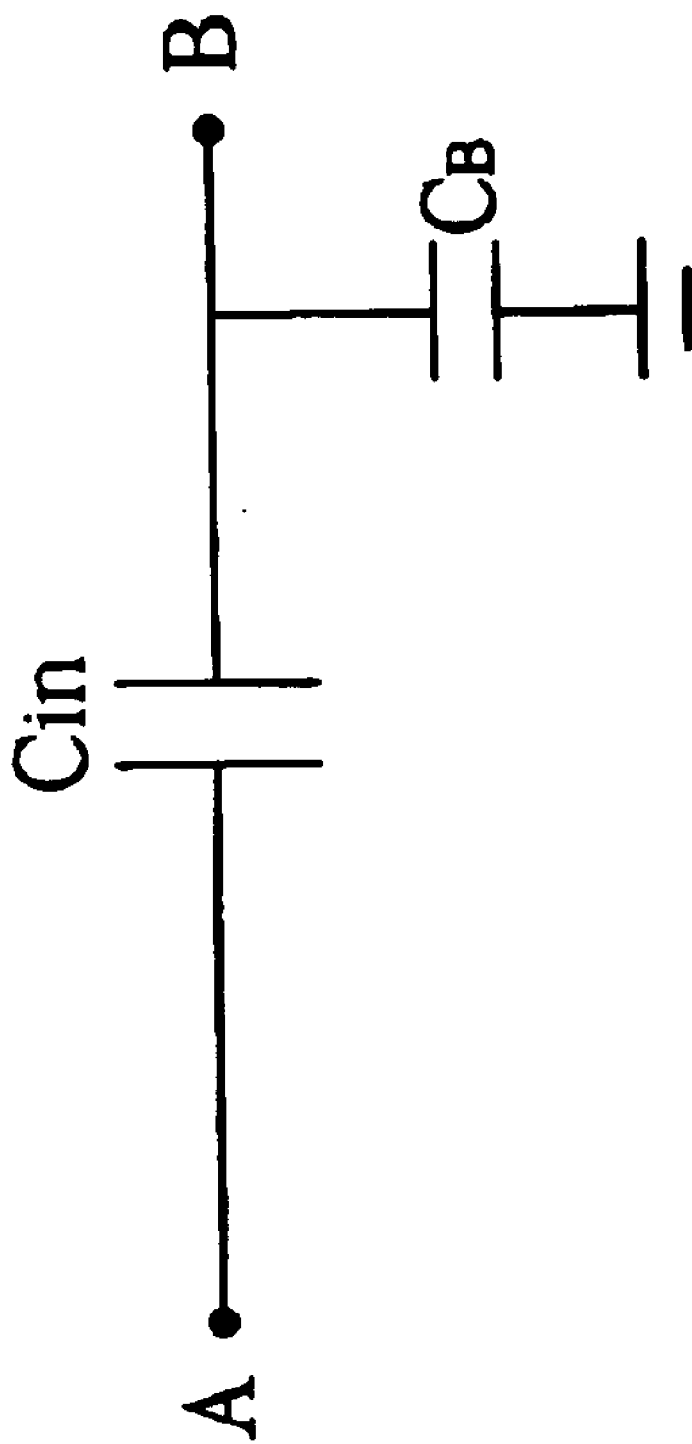
FIG. 6 is an equivalent circuit diagram of the integrated capacitor as set forth in FIG. 5.

Please refer to FIG. 6. FIG. 6 is an equivalent circuit diagram of the integrated capacitor unit 40 as set forth in FIG. 5. The outer vertical metal plate 41 of the integrated capacitor unit 40 is electrically connected to the node A, and the inner vertical metal plates 42 of the integrated capacitor unit 40 are electrically connected to the node B via the bottom conductive plate 43. In operation, inter-plate capacitance $C_{in}$ and parasitic capacitance $C_B$ are generated between the node A and the node B. The parasitic capacitance $C_B$ is induced between the bottom conductive plate 43 and the electrically grounded semiconductor substrate. It is noteworthy that there is no parasitic capacitance produced at the node A due to the shielding of the bottom conductive plate 43. Since the integrated capacitor unit 40 has a polar property, it is suited for the design of analog/digital (A/D) converters, digital/analog (D/A) converters, and switch cap circuits.

Figure 7:
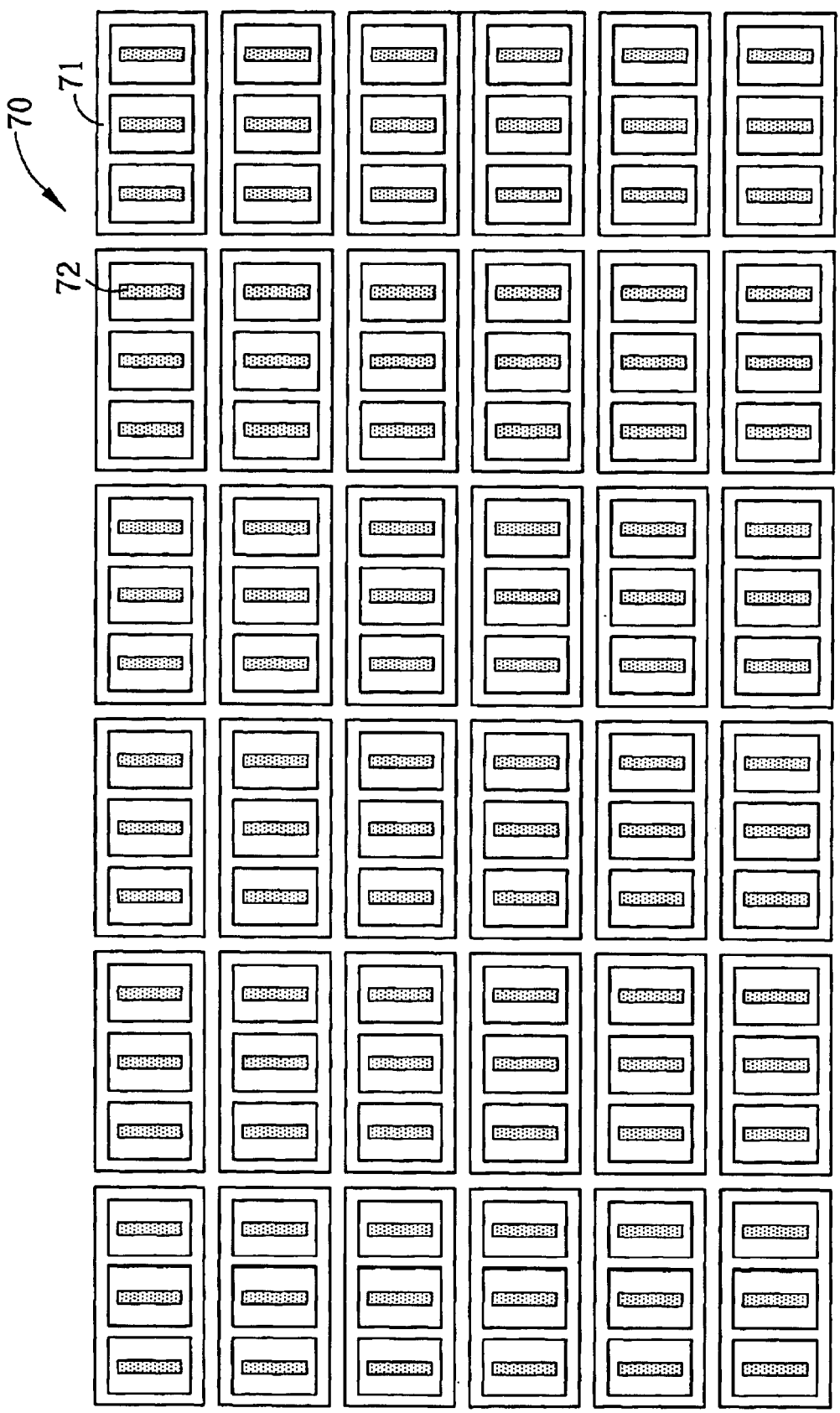
FIG. 7 is an enlarged top view of the integrated capacitor structure according to another preferred embodiment of this invention.

Please refer to FIG. 7. FIG. 7 is an enlarged top view illustrating a portion of the symmetric, perfectly matching integrated capacitor structure according to this invention. As shown in FIG. 7, the integrated capacitor structure is comprised of a matrix of symmetric integrated capacitor units 70, each of which comprises an outer vertical metal plate 71 in a grid form and inner vertical metal plates 72. The outer vertical metal plate 71 is electrically connected to the node A and the inner vertical metal plates 72 are electrically connected to the node B. Since the four sides of each of the integrated capacitor units 70 are facing substantially same surrounding environment, the integrated capacitor structure according to this invention is therefore approaching perfect matching. There is no need in this invention to adopt dummy metals that typically lay surrounding each of the integrated capacitor units, and hence saving a lot of valuable chip area and production cost.

Further, this invention also discloses a method of forming an integrated capacitor. The method comprises the following steps:(a) providing a semiconductor substrate comprising an outer vertical plate consisting of a plurality of first conductive slabs connected vertically using multiple first via plugs, and an inner vertical plate consisting of a plurality of second conductive slabs connected vertically using multiple second via plugs, wherein the outer vertical plate defines a grid area, and the inner vertical plate is encompassed by the grid area defined by the outer vertical plate;(b) providing a conductive plate under the outer vertical plate and the inner vertical plate on the semiconductor substrate for shielding the outer vertical plate from producing a plate-to-substrate parasitic capacitance thereof; and (c) electrically connecting the inner vertical plate with the conductive plate using at least one third via plug.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated capacitor comprising:
   a semiconductor substrate;
   an outer vertical plate laid over the semiconductor substrate, the outer vertical plate consisting of a plurality of first conductive slabs connected vertically using multiple first via plugs, wherein the outer vertical plate defines a grid area;
   an inner vertical plate laid over the semiconductor substrate in parallel with the first vertical plate and encompassed by the grid area defined by the outer vertical plate, wherein the inner vertical plate consisting of a plurality of second conductive slabs connected vertically using multiple second via plugs; and
   a horizontal conductive plate laid under the outer vertical plate and inner vertical plate over the semiconductor substrate for shielding the outer vertical plate from producing a plate-to-substrate parasitic capacitance thereof;
   wherein the inner vertical plate is electrically connected with the horizontal conductive plate using at least one third via plug.

2. The integrated capacitor of claim 1 wherein the horizontal conductive plate is floating and is made of metal.

3. The integrated capacitor of claim 1 wherein the horizontal conductive plate and the overlaying outer vertical plate are isolated from each other by at least one layer of dielectric material.

4. The integrated capacitor of claim 1 wherein both of the first conductive slab and the second conductive slab are made of metal.

5. The integrated capacitor of claim 1 wherein the outer plate and the inner vertical plate are electrically isolated from each other.

6. The integrated capacitor of claim 1 wherein when the outer vertical plate is electrically connected to a node A, the inner vertical plate is electrically connected to a node B, and the semiconductor substrate is grounded, the plate-to-substrate parasitic capacitance is produced at the node B.

7. The integrated capacitor of claim 6 wherein when the outer vertical plate is electrically connected to a node A, the inner vertical plate is electrically connected to a node B, and the semiconductor substrate is grounded, there is no plate-to-substrate parasitic capacitance produced at the node A.

8. A method of forming an electrically polar integrated capacitor, comprising the steps of:
   providing a semiconductor substrate comprising an outer vertical plate consisting of a plurality of first conductive slabs connected vertically using multiple first via plugs, and an inner vertical plate consisting of a plurality of second conductive slabs connected vertically using multiple second via plugs, wherein the outer vertical plate defines a grid area, and the inner vertical plate is encompassed by the grid area defined by the outer vertical plate;
   providing a conductive plate under the outer vertical plate and the inner vertical plate on the semiconductor substrate for shielding the outer vertical plate from producing a plate-to-substrate parasitic capacitance thereof; and
   electrically connecting the inner vertical plate with the conductive plate using at least one third via plug.

9. The method of claim 8 wherein the conductive plate is floating and is made of metal.

10. The method of claim 8 wherein the conductive plate and the overlaying outer vertical plate are isolated from each other by at least one layer of dielectric material.

11. The method of claim 8 wherein when the outer vertical plate is electrically connected to a node A, the inner vertical plate is electrically connected to a node B, and the semiconductor substrate is grounded, the plate-to-substrate parasitic capacitance is produced at the node B.

12. The method of claim 8 wherein when the outer vertical plate is electrically connected to a node A, the inner vertical plate is electrically connected to a node B, and the semiconductor substrate is grounded, there is no plate-to-substrate parasitic capacitance produced at the node A.

13. A method of forming an electrically polar integrated capacitor, comprising:
   providing a semiconductor substrate;
   providing a conductive plate on the semiconductor substrate, wherein the conductive plate is electrically isolated from the semiconductor substrate;
   providing a plurality of first capacitor members and second capacitor members insulated from the first capacitor members over the conductive plate, wherein the first capacitor members define a grid area encompassing the second capacitor member to form an integrated capacitor; wherein each of the plurality of first capacitor members is isolated from the conductive plate by at least one layer of dielectric material;
   electrically isolating the first capacitor members from the underlying conductive plate; and
   electrically connecting the second capacitor members with the underlying conductive plate.

14. The method of claim 13 wherein each of the plurality of first or second capacitor members is a vertical plate consisting of a plurality of conductive slabs connected vertically using multiple via plugs.

15. The method of claim 13 wherein each of the plurality of first or second capacitor members is a vertical capacitor bar consisting of a plurality of conductive squares connected vertically using multiple via plugs.

16. The method of claim 13 wherein the first capacitor member and the second capacitor member are arranged in a symmetric manner to form a matching capacitor unit.

17. The method of claim 13 wherein the conductive plate is floating and is made of metal.

* * * * *

UNITED STATES PATENT AND TRADEMARK OFFICE
CERTIFICATE OF CORRECTION

PATENT NO. : 6,743,671 B2
DATED : June 1, 2004
INVENTOR(S) : Hu, Man-Chun

It is certified that error appears in the above-identified patent and that said Letters Patent is hereby corrected as shown below:

<u>Title page, Item [54] and Column 1, lines 1-4,</u>
Title, change "METAL-ON-METAL CAPACITOR WITH CONDUCTIVE PLATE FOR PREVENTING PARASITIC CAPACITANCE AND METHOD OF MAKING THE SAME" so that the title reads as follows: -- INTEGRATED CAPACITOR AND METHOD OF MAKING SAME --.

Signed and Sealed this

Twenty-third Day of November, 2004

JON W. DUDAS
*Director of the United States Patent and Trademark Office*